United States Patent [19]

Vancelette

[11] 4,288,914
[45] Sep. 15, 1981

[54] ADJUSTABLE MECHANISM FOR CUTTING AND CLINCHING ELECTRICAL COMPONENT LEADS

[75] Inventor: Stanley R. Vancelette, Manchester, N.H.

[73] Assignee: USM Corporation, Farmington, Conn.

[21] Appl. No.: 202,245

[22] Filed: Oct. 30, 1980

Related U.S. Application Data

[63] Continuation of Ser. No. 942,286, Sep. 14, 1978, abandoned.

[51] Int. Cl.³ .......................... B23P 19/00; B21F 1/00
[52] U.S. Cl. .................................... 29/741; 140/105
[58] Field of Search ...................... 29/739, 740, 741; 83/62, 63; 140/1, 93 D, 105

[56] References Cited

U.S. PATENT DOCUMENTS

| | | | |
|---|---|---|---|
| 2,867,810 | 1/1959 | Gagnon | 29/741 X |
| 2,893,010 | 7/1959 | Stuhre | 29/741 X |
| 3,429,170 | 2/1969 | Romeo | 29/741 X |
| 3,645,156 | 2/1972 | Meyer et al. | 83/62 X |
| 3,724,055 | 4/1973 | Holmes et al. | 29/739 X |
| 3,986,533 | 10/1976 | Woodman | 140/105 |
| 4,051,593 | 10/1977 | Mori et al. | 29/741 X |
| 4,153,082 | 5/1979 | Foley | 140/105 |

FOREIGN PATENT DOCUMENTS 7713779 6/1978 Netherlands ................. 140/105

Primary Examiner—Ervin M. Combs
Attorney, Agent, or Firm—Donald N. Halgren; Owen J. Meegan

[57] ABSTRACT

A cut-clinch mechanism of compact structure operates on variably spaced leads of components after their insertion to clinch them directionally at an angle selectable between 90° plus or minus 45° to the line connecting the lead-receiving holes of a circuit board. The leads are clinched in parallel for optimum component stability, and their lengths are adjustable by shims. The movable one of each of two pairs of cutting knives pivots about an axis parallel to the board and has a configuration to wipe the cut lead thereagainst while exerting only small force tending to lift the board. For control purposes the presence of the component lead to be clinched is ascertained by the lead completing a circuit between the cooperating knives; and completion of its clinching by means of the movable knife.

1 Claim, 12 Drawing Figures

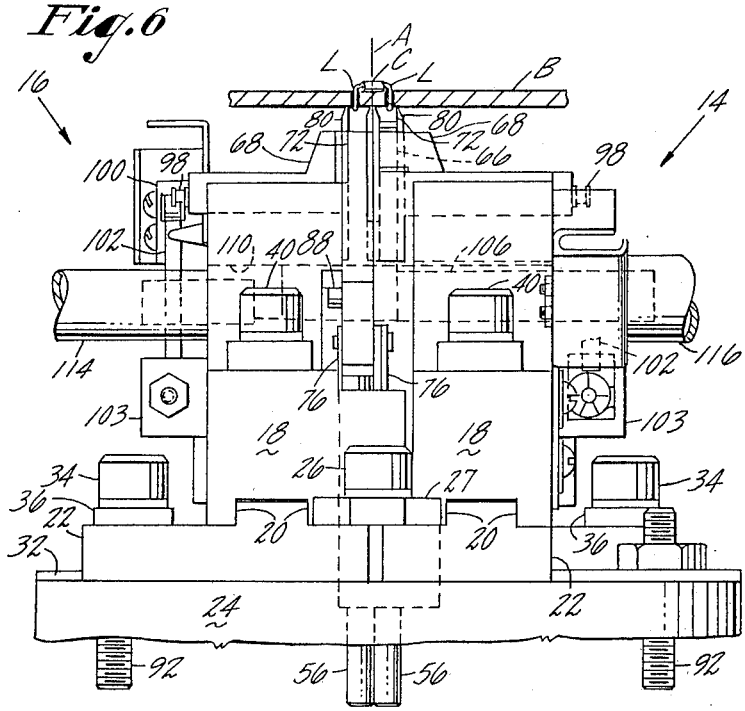
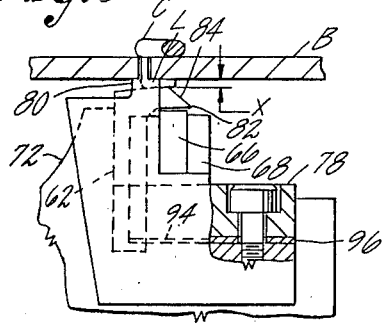
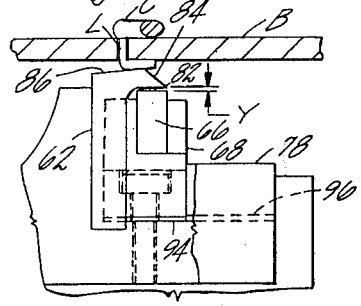

ADJUSTABLE MECHANISM FOR CUTTING AND CLINCHING ELECTRICAL COMPONENT LEADS

CROSS-REFERENCE TO RELATED APPLICATION

This is a continuation of application Ser. No. 942,286, filed Sept. 14, 1978, abandoned.

An application, Ser. No. 897,781, for U.S. Letters Patent No. was filed Apr. 19, 1978 in the name of Michael S. Foley, now U.S. Pat. No. 4,153,082. It relates to cut-clinch mechanism and is assigned to the assignee of this application.

BACKGROUND OF THE INVENTION

This invention relates to mechanism for trimming the inserted leads of components mounted in preformed holes of circuit boards, or the like, and then bending the cut leads to effect their electrical connection, usually to the printed circuitry on the boards.

As components to be mounted on circuit boards by lead insertion have become smaller and more densely arranged, it has become desirable to provide more versatile and more compact cut-clinch mechanisms for suitably trimming the leads and directing the cut leads for reliable electric connection to the printed circuitry on the boards. In U.S. Pat. No. 3,429,170 to Romeo, for instance, there is disclosed a pair of cut-clinch mechanisms rotatable about an axis normal to the circuit board to orient the mechanisms according to the position of the leads extending through the board. Such an arrangement has found wide usage but lacks capability to handle different lead or "leg" spacings, i.e. the distance (which may vary) between the centers of preformed lead-receiving holes in the board. Other cut-clinch mechanisms, though perhaps including variable leg spacing and though effective for trimming the leads projecting through such holes, have tended either to force the inserted leads back through the holes to some extent or unduly displaced the board itself so that the component after mounting was inadequately secured or became loosened with time and hence improperly electrically connected.

In the prior art, cut-clinch means have hitherto provided circuitry including an inserter for sensing the proper insertion of leads to be clinched when they have been detected as simply projecting from their lead holes. That arrangement is of course inadequate or ineffective for controlling inserting cycles when the printed circuit board holes are through-plated since inserting means being difficult to insulate, the plating completes the electric circuit between the inserting mechanism and the cut-clinch means and thus would prematurely return an inserting member. Moreover, in other respects such as the lack of capability for changing the length of a lead to be clinched or the angle to be defined by the clinched lead and the circuit board, the prior art arrangements have not been fully satisfactory. Such inadequacies and lack of versatility are overcome in the novel circuit and other arrangements herein proposed.

SUMMARY OF THE INVENTION

In view of the foregoing and other factors, it is an object of this invention to provide an improved cut-clinch mechanism afforded by a non-complex assembly which shall be compact yet have all-round capabilities not generally present in prior art arrangements.

Another object of the invention is to provide a cut-clinch assembly for reliably effecting secure mounting of a two-leaded component on a circuit board, the leads being cut and then wipingly clinched in selected opposite directions within a sector the median of which is normal to the component axis to effect good electrical connection with circuitry on the board.

To these and other ends, and as herein shown, a cut-clinch assembly comprises a pair of corresponding, laterally and rotatably adjustable cut-clinch units each including a relatively stationary knife and a relatively movable knife pivotable about an axis generally parallel to a circuit board on which an electrical component is to be secured. The movable knife has a configuration such that after severing a projecting lead, the knife moves past the stationary knife to clinch the lead in the selected direction which is 180° from the clinching direction being effected by the other of the simultaneously operating cut-clinch units. Preferably each movable knife has a lead-cutting edge from which an angular clinching surface extends, a leading portion of that surface extending from that edge with inclination toward a surface of the board against which the lead is to be wiped. A trailing portion of that surface extends away from that board surface at the time of lead wiping to minimize force which might tend to urge the inserted lead back out of its receiving hole. Means preferably is provided for advantageously shimming either or both of the stationary knives of a cooperating pair, and a board engageable member extending thereabove to attain performance appropriate to different operating conditions.

BRIEF DESCRIPTION OF THE DRAWINGS

The foregoing and other features of the invention will now be more particularly described in connection with an illustrative embodiment and with reference to the accompanying drawings thereof, in which:

FIG. 6 is a view in elevation taken in the direction of the arrows VI—VI in FIG. 5;

FIGS. 9 and 10 are detail views illustrating usage of shims for different adjustment purposes.

DESCRIPTION OF PREFERRED EMBODIMENT

Figure 1:
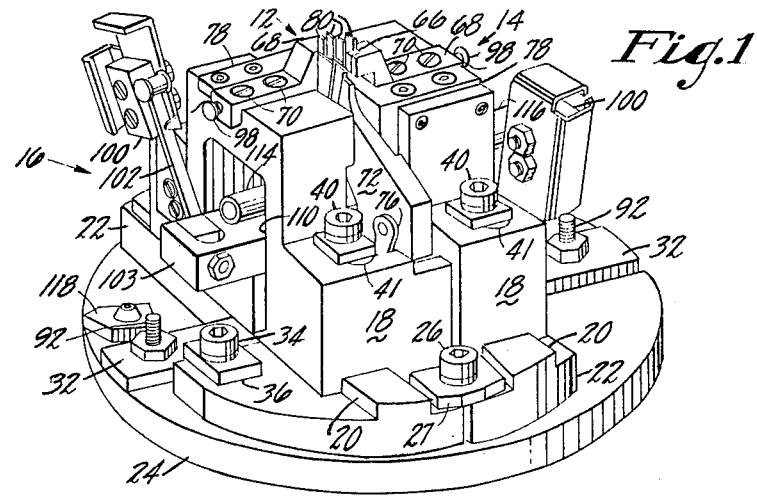
FIG. 1 is a perspective view of a cut-clinch assembly disassociated from its operating means and comprising a pair of substantially identical cut-clinch units for respectively operating on a component lead.
Figure 2:
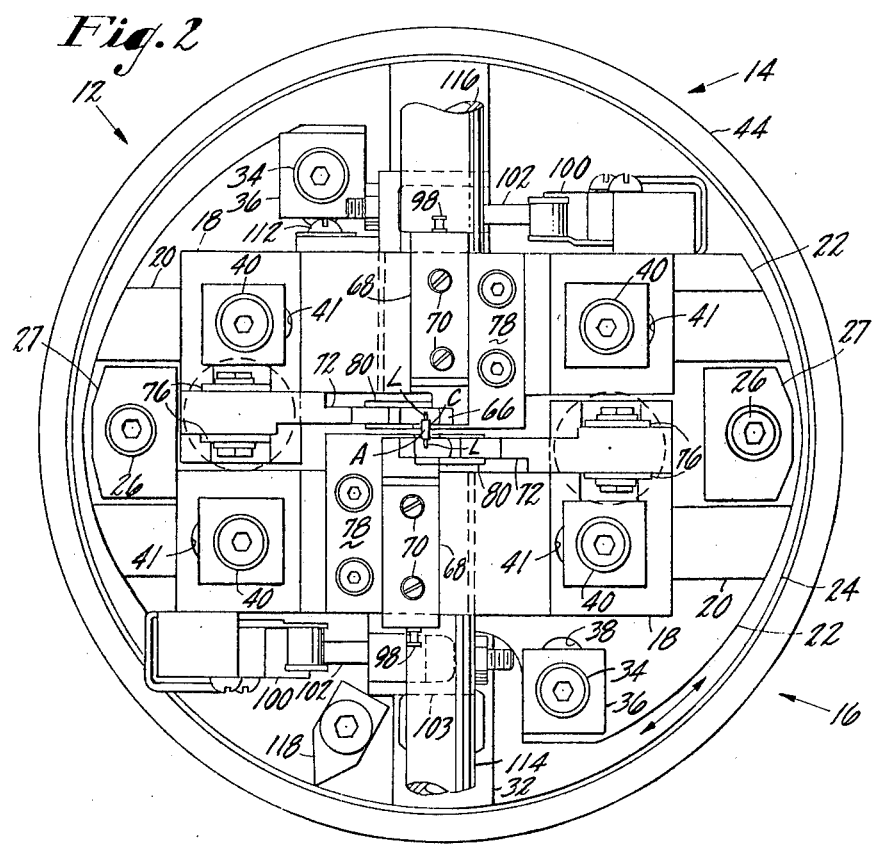
FIG. 2 is a plan view of the assembly largely as shown in FIG. 1, a component to be clinched being shown.
Figure 3:
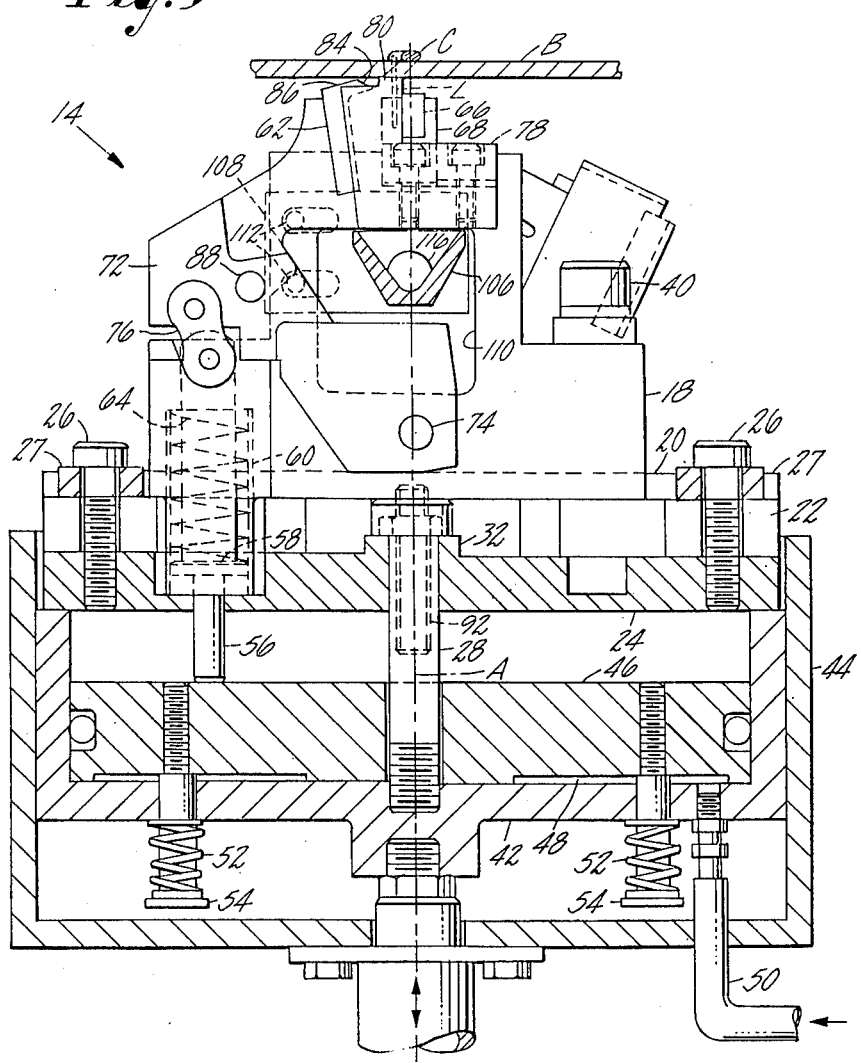
FIG. 3 is a section taken on the broken line III—III of FIG. 5 to show in lower inoperative positions with its actuating means, one of the cut-clinch units of FIG. 1 and its relatively movable knife and a relatively fixed knife cooperative therewith, a lead having been inserted in a circuit board and to be cut-clinched.

Referring first to FIGS. 1, 2 and 3, a cut-clinch assembly generally designated 12 is provided for securing electronic components having bodies C and leads L,L on a support, for instance a circuit board B (FIG. 3) preformed to receive the leads endwise. The assembly comprises a pair of substantially identical cut-clinch units 14,16 arranged side by side and respectively adjustable relative to one another as will next be described. Since the units 14 and 16 are alike, only one need be described in detail, like reference characters being applied to corresponding parts of the units.

Figure 4:
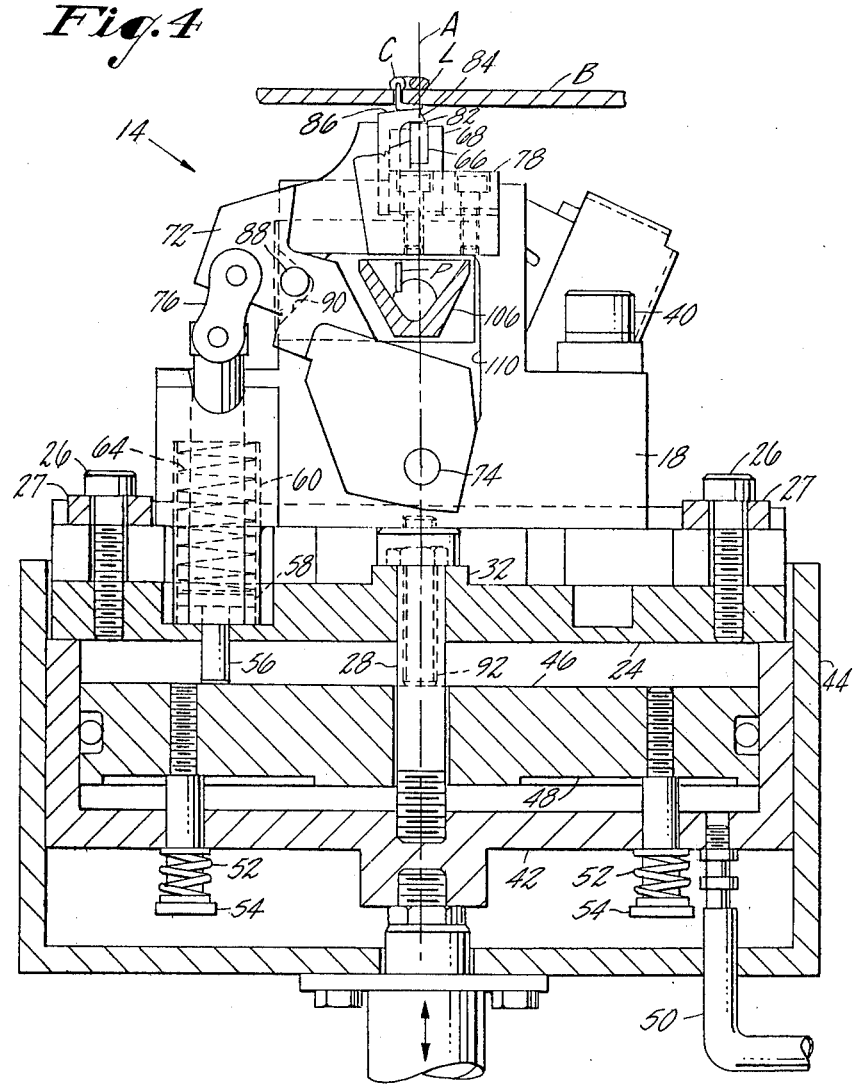
FIG. 4 is a view similar to FIG. 3 and showing the parts at a next stage wherein the lead has been cut and clinched, the severed portion of the lead being removed.
Figure 5:
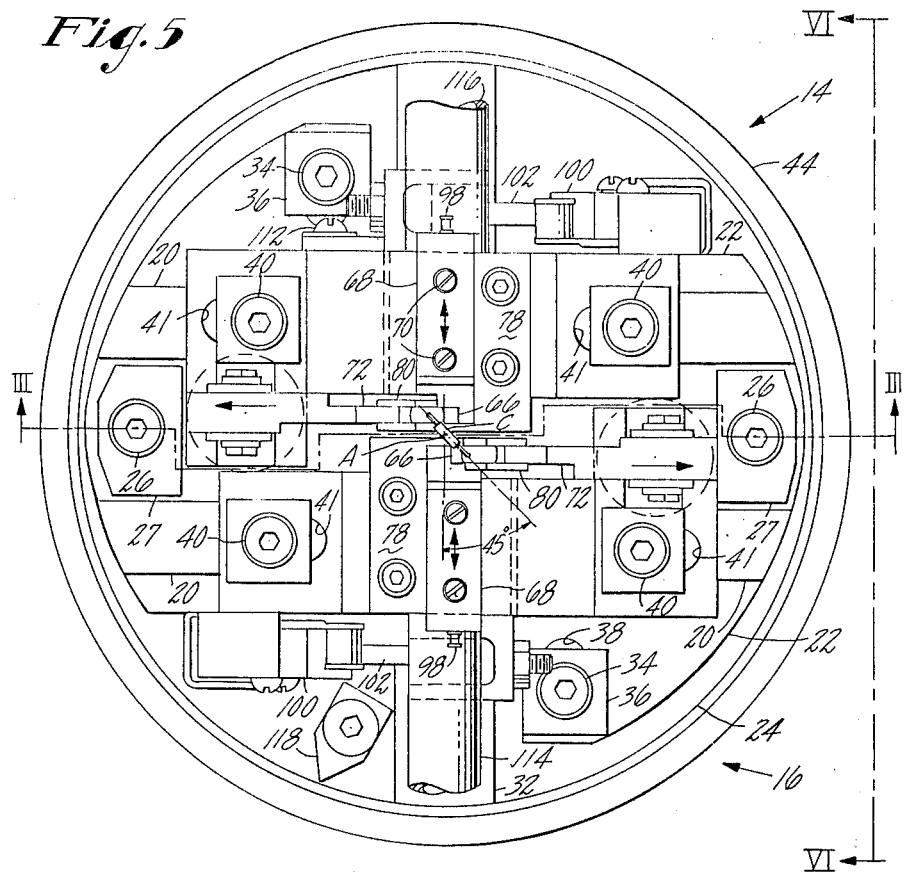
FIG. 5 is a plan view similar to FIG. 2 except that the position of the component to be clinched has been angularly shifted, for instance 45°, and the positions of the operating parts have accordingly been correspondingly moved, the adjustment being indicated by arrows for both cut-clinch units.

Each of the units 14,16 includes an upstanding block 18 slidable on parallel guideways 20 respectively formed on the tops of otherwise flat and complemental base plates 22,22. These plates in butting relation are clamped to the horizontal top of a circular rotatable disc 24 by means of a pair of bolts 26,26 (and bolts 34 subsequently referred to) which extend slidably through a washer 27 and complemental half-bores formed in the plates 22 and are threaded into the disc 24. The latter is centrally bored to receive a vertical holddown screw 28. The lower position of the units is shown in FIG. 3, and the upper position is shown in FIG. 4.

For enabling the units 14,16 (hereinafter explained in more detail) to be adjustably spaced apart in a direction normal to that of the guideways 20,20, i.e. in a direction transverse of the respective planes in which the cut-clinch units operate as later described, the disc 24 has a diametral land or tongue-and-groove joint 32 with the plates 22. Thus, cap screws 34,34 and 26,26 (FIG. 2) slidably projecting washers 27 and 36 and an elongated slot 38 in each of the plates 22 are threadedly received in the disc 24 to permit the units 14,16 to be selectively fixed apart and clamped along the tongue and groove joint 32. Similarly these units are secured in selected positions along the guideways 20 by means of a pair of cap screws 40,40 each of which extends through a washer and a vertical bore 41 of the block 18 (and elongated in the direction of the guideways) and threaded into the plates 22 to have frictional binding engagement with the tops of the guideways 20.

The screw 28 is secured to a hollow cylindrical member 42 (FIGS. 3,4) affixed in a housing 44 within which the disc 24 and hence the units 14,16 are adjustable about a vertical axis A normally intersecting a midpoint between the centers of board holes preformed for receiving the leads L,L. This axis may be termed the "center of insertion". The housing 44 is movable heightwise by means not shown in detail herein between a lower inoperative position and an upper operating position. For pneumatically actuating the units 14,16, a piston 46 is vertically slidable in the member 42. The arrangement preferably is such that, upon signal that lead insertion has been made in the board B, air under pressure is introduced into a chamber 48 beneath the piston 46 via a tube 50. The piston is accordingly urged upwardly against the influence of a pair of return springs 52,52 respectively confined between the heads of screws 54 and the member 42, the stems of the screws being threaded into the piston and slidably extending through bores, respectively, in the bottom of the member 42. Raising of the piston 46 simultaneously actuates a piston rod 56 and its piston 58 (one only shown in FIGS. 3 and 4) operable in each of cylinders 60 formed in the blocks 18, respectively. Accordingly, by interconnecting linkage about to be described, a relatively movable cutting and clinching knife 62 is urged, against resistance of a return spring 64, to close for cooperative lead shearing relation with a relatively fixed knife 66. The latter for a purpose later described is secured as by brazing, to an insulated (for instance, ceramically coated) conductive holder 68 screwed to the top of the block 18 by screws 70,70 extending through insulating washers. The movable knife 62 is carried by a lever 72 pivotally supported at its lower portion on a pin 74 in the block 18 for movement about an axis substantially parallel to the plane of the circuit board B. The lever is operatively connected to the upper end of the piston rod 56 by a pair of links 76,76. Partly nested in a slot in the top of the block 18 beside the holder 68 is a removable lead guide block 78, the inner and upper end portion of which is forked to define the operating path of the movable knife 62. Upper ends 80,80 of this forked portion predeterminedly extend above the path of the knife 62 and are arranged to abut the underside of the circuit board B adjacent to opposite edges of a leadreceiving hole therein, when a unit 14 or 16 is in its upper, operative position, as shown in FIG. 9, thus to determine the level of the underside of the board B in relation to the movable knife 62.

Particular note of the advantageous shape and function of the upper operative portion of the movable knife 62 should be made. It has a leading cutting edge 82 (FIGS. 9, 10) and a lead-clinching surface 84 extending upwardly therefrom at an acute angle toward the undersurface of the board B. The upper end portion of the knife 62 further includes a trailing or lead-wiping surface 86 less inclined to the circuit board than the clinching surface 84. The arrangement is such at the arcuate operating motion of the knife 62 about the axis of the pin 74 first causes the edge 82 to shear the projecting lead L as shown in FIG. 4 in cooperation with the stationary knife 66, and then swings further (to the right as seen in FIG. 4) beyond the knife 66 to clinch the cut lead L against the board, the surfaces 84,86 acting successively on the lead to appropriately bend and wipe it in the desired direction and advantageously press it against the board without exerting any appreciable force tending to back the lead out of its circuit board hole. A stop pin 88 (FIG. 4) secured in the lever 72 is arranged to engage the wall of a slot 90 formed in the block 18 to limit the movement of the knife 62 clockwise as seen in FIG. 4. For adjustably determining the stroke of the knives 62, a pair of stop screws 92 is threaded through the disc 24 for spaced endwise engagements with the upper face of the piston 46.

The length of clinched leads may be changed by shifting the cut-clinch unit 14 or 16 along the guideways 20 and relative to the center of insertion axis A since this modifies the distance therefrom of the relatively stationary knife 66. The lead length and the angle which the lead makes with the board after cutting and wiping can be changed by adjusting distance X (FIG. 9). To adjust the distance designated X in FIG. 9 between the top of the movable clinching knife 62 when closest to the board B and its undersurface, a shim 96 (FIG. 9) of selected thickness may be inserted on the block 18 beneath the lead guide block 78. To adjust and establish proper clearance (designated Y in FIG. 10) between the knives 62,66 so as to properly cut the lead L, a selected thickness of shim 94 may be inserted in the block 18 immediately beneath the fixed knife holder 68. The shim 94 also serves to insure provision of an air gap affording electrical insulation between the knives 62,66 when a component lead is missing, i.e. for some reason non-inserted through the board B.

Figure 11:
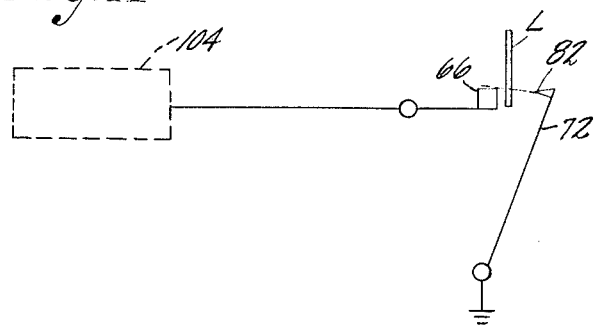
FIGS. 11 and 12 are schematic views of control circuits which may be associated with the cut-clinch mechanism.
Figure 12:
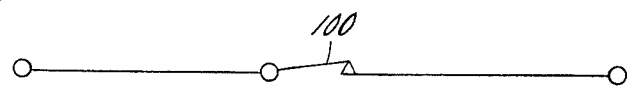

The fixed knife 66, except for its cutting surface and a solder terminal 98 by which it is connected to an energizing circuit (FIG. 11), is electrically insulated from adjacent parts. Accordingly when an inserted lead L is being shorn a circuit is thereby completed directly between the knives 62,66 utilizing conductivity of the shorn lead. As shown in FIG. 11, each inserted lead when cut may energize an electrical latch 104 whereby, for instance, a computer can "look" at the conditions and dictate appropriate further operations. Non-inclusion of any part of the board or mechanism thereabove in the sensing circuit avoids the chance of receiving a false control signal. Opening of the normally closed limit switch 100, as when the knife 62 has completed its clinching stroke, will complete a control signal usually for effecting upward retraction of a cyclically reciprocable inserting device (not shown) bearing upon the successive component bodies C. The switch 100 is supported on an outer side of the block 18, its spring operating arm 102 being forced to a switch-open position when its lower end is displaced from its normally closed contact by the pivotal motion of an adjustable contact in a lower portion 103 (FIGS. 1 and 6) of the lever 72. The switch 100 instead of being used to signal completion of clinching stroke can be wired in the circuit of FIG. 11 between the fixed knife 66 and the electrical latch 104. Opening of the switch 100 will then determine specific interval during which component sensing can occur.

For disposing of unused cut-off lead portions P (FIG. 4), a trough 106 (FIG. 3) having a mounting bracket 108 is provided. The trough extends with clearance of its sidewalls through openings 110 in the respective blocks 18, but its top surface, which is at least partly open, closely engages the top wall of the openings 110, and it is adjustably secured to the side of one of these blocks by a pair of screws 112 respectively extending through parallel elongated slots formed in the bracket. Tubular end portions of the trough are connected to air blast conduits 114, 116, whereby the expendable lead portions are discharged.

An arrow type indicator 118 may be secured on the disc 24 to point to angular orientation indicia, for instance radial degree marks (not shown) arranged in a circle on the housing 44. This enables the operator predeterminedly to relatively shift the units 14 and 16 together about the center of insertion axis A, for instance to attain the different angular clinches shown in FIGS. 7 and 8.

Operation of the assembly 12 will now be briefly reviewed. The inserted component C has its lead legs L,L to be clinched projecting downwardly from the board B usually at equal distances from the inserting center axis A. The direction of clinching and length of the leads to be trimmed are normally determined by the printed circuitry to be electrically connected thereby. The assembly 12 is designed, as has been seen, variably to sever both leads simultaneously and then clinch them directionally within a sector disposed at an angle of 90° plus or minus 45° to a line interconnecting the lead receiving holes in the board, and in variable but directly opposite directions for maximum stability of the mounted component.

It will be understood that the board B may have been shifted, by any suitable means, in its own plane to appropriately locate the lead receiving holes relative to the axis A, or vice versa.

With the housing 44 elevated, the inserted lead legs project between the forked ends 80,80 of the guide block 78 abutting the underside of the board; the leads also extend into the air gap between the fixed knife 66 and the then inoperative movable knife 62 of each of the units 14,16. Upon air under pressure being next admitted via the tube 50 to raise the piston 46 until it abuts the stop screws 92,92, the levers 72 counter-rotate yieldingly about their pivot pins 74 to carry the knives 62 into shearing relation with the knives 66, respectively. If longer shorn lead portions are desired for electrical connection, the units 14,16 are moved in a direction that will increase the distance between the inserted lead and the stationary knife. Electrical contact is established between the pair of knives and its inserted lead during shearing and each moving knife travels beyond its cooperating stationary knife to effect the clinching in the direction selected.

Figure 7:
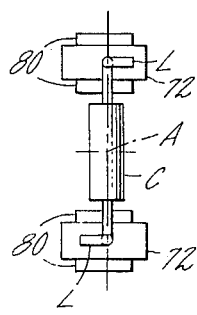
FIGS. 7 and 8 are views indicating lead-receiving holes of a circuit board and, within a sectorial range, different selected directional clinching relative to a line interconnecting the centers of such holes.
Figure 8:
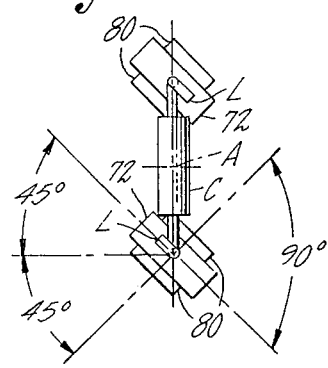

The clinching for the component C shown in FIG. 2 is normal to its axis and in opposite directions as indicated in FIG. 7. Angularity of the clinching paths of the laterlly offset knives 62 is determined by the selected orientation of the parallel guideways 20,20, by rotation of the disc 24 about the axis A. FIG. 8 diagrammatically indicates for one lead the 90° sectorial range limits on each side of a component axis wherein clinching may be effected. To adjust for the spacing of each unit between lead holes of the board B the cap screws 40,40 are employed to free or bind it upon its guideway 20, and the cap screws 26,26,34,34 are employed to free or bind it upon its tongue and groove joint 32.

I claim:

1. A cut-clinch assembly for acting on component leads inserted through spaced receiving holes of a circuit board, comprising:

a pair of cut-clinch units arranged in side-by-side relation;

means mounting the units for movement toward and from the circuit board and for angular adjustment about an inserting axis normal to the board, each of the units comprising a fixed knife and a relatively movable knife cooperative therewith to shear a lead and then to clinch it against the board;

a mechanism for actuating the movable knives;

means for adjusting operating positions of the units in a direction parallel to a line interconnecting said receiving holes, and means for adjusting an operating position of the units in a direction normal to said line;

each cut-clinch unit comprising a block for supporting a non-conductive holder of the fixed knife and a lead guide block having at least a portion extending above said knife and engageable with the board at opposite sides of a lead-receiving hole, and a pair of shims of selected thickness insertable one between the block and an underside of said holder and the other between the block and an underside of said lead guide block to adjust the distance between an upper surface of said movable knife and an under surface of said circuit board to permit adjustment of the lead length and angle the lead makes with the board after cutting, and to adjust the distance between the knives to establish a proper clearance therebetween, respectively.

* * * * *